United States Patent [19]

Crouse

[11] 4,270,972
[45] Jun. 2, 1981

[54] METHOD FOR CONTROLLED DOPING SEMICONDUCTOR MATERIAL WITH HIGHLY VOLATILE DOPANT

[75] Inventor: Allen G. Crouse, Tustin, Calif.

[73] Assignee: Rockwell International Corporation, El Segundo, Calif.

[21] Appl. No.: 135,385

[22] Filed: Mar. 31, 1980

[51] Int. Cl.³ ............... C30B 13/10; C30B 13/12
[52] U.S. Cl. .................. 156/605; 156/620; 118/900; 427/85; 422/250
[58] Field of Search ............ 156/605, 620, DIG. 64, 156/610, 612; 422/247, 250, 253; 118/900; 13/132 M; 75/65 ZM; 221/79, 278; 148/186–189, 175; 427/85, 255.5, 248.1

[56] References Cited

U.S. PATENT DOCUMENTS

| | | | |
|---|---|---|---|
| 2,768,914 | 10/1956 | Buehler et al. | 156/605 |
| 2,851,341 | 9/1958 | Weiss | 156/605 |
| 3,040,727 | 6/1962 | Edwards et al. | 221/79 |
| 3,065,062 | 11/1962 | Enk et al. | 156/605 |
| 3,141,848 | 7/1964 | Enk et al. | 156/605 |
| 3,175,975 | 3/1965 | Fuller | 252/62.3 |
| 3,804,682 | 4/1974 | Keller | 156/605 |
| 3,954,416 | 5/1976 | Keller | 156/605 |
| 4,040,890 | 8/1977 | Burrus, Jr. et al. | 156/605 |
| 4,110,586 | 8/1978 | Kohl et al. | 156/605 |
| 4,126,509 | 11/1978 | Keller et al. | 156/605 |

OTHER PUBLICATIONS

Plovnick and Schmidt, "A Dopant Injector", Published in Rev. Sci. Instrum., vol. 41, #8, Aug. 1970, pp. 1248–1249.

*Primary Examiner*—Frank W. Lutter
*Assistant Examiner*—Gregory N. Clements
*Attorney, Agent, or Firm*—H. Frederick Hamann; Gilbert H. Friedman

[57] ABSTRACT

In conjunction with the use of a float-zone crystal grower for doping silicon, a holder for temporarily storing pellets of solid dopant is disposed outside the housing of the crystal grower. A rotatable cylinder in the holder is provided with a plurality of chambers into which charges of varying amounts of dopant may be stored. A separate charge of dopant is propelled by inert gas under pressure into the melt zone of a silicon rod in the crystal grower upon the occurrence of a specified event such as passage of time or translation of the silicon rod. The apparatus and method are particularly applicable to doping with a highly volatile dopant such as indium.

4 Claims, 3 Drawing Figures

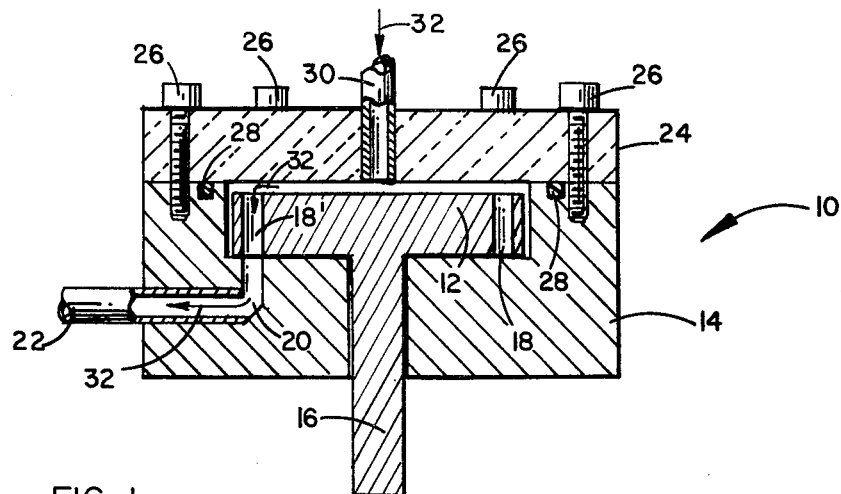
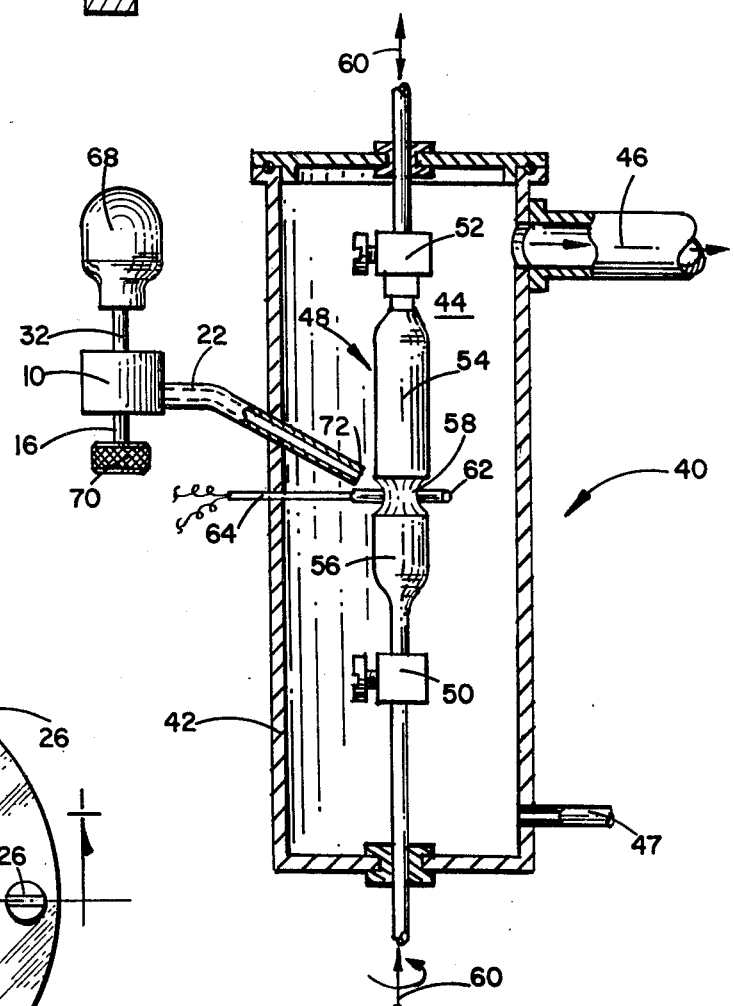
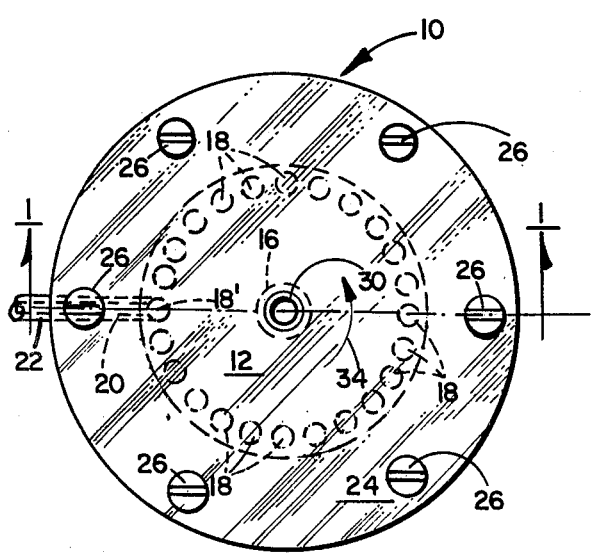
FIG. 1
FIG. 2
FIG. 3

METHOD FOR CONTROLLED DOPING SEMICONDUCTOR MATERIAL WITH HIGHLY VOLATILE DOPANT

The invention herein described was made in the course of or under a contract or subcontract thereunder (or grant) with the Department of the Air Force.

BACKGROUND OF THE INVENTION

1. Field of the Invention

This invention relates to doping of semiconductor material and more particularly to a method and apparatus for controlling the doping of a body of single-crystal semiconductor material to a desired heavy concentration of a highly volatile dopant such as, for example, indium.

2. Description of the Prior Art

High-purity single-crystal silicon heavily doped with indium is useful as detector material. Such material has been made satisfactorily in float-zone crystal growers. In the prior-art process, a rod of purified polycrystalline silicon about thirty to forty centimeters long is prepared for doping by removing a core about ten centimeters long from one end of the rod. After cleaning the resulting hole with an appropriate acid to remove contaminants, a charge of indium is placed therein. The amount of indium used in the charge is empirically determined to produce a heavy dopant concentration between desired limits in at least a portion of the subsequently processed rod. After the dopant is in place, the hole is closed with a plug of purified silicon. The rod of silicon is then mounted in a float-zone crystal grower and passed through the crystal grower's heating coil, dopant-charged end first, to grow a single crystal of indium-doped silicon.

A substantial amount of high-quality indium-doped silicon has been made by the prior-art procedure described above. However, the procedure has several disadvantages which tend to make it relatively costly and time consuming.

One disadvantage is that not all of a rod of silicon of reasonably practical length can be doped to the required heavy concentration of indium within a preselected specified narrow range of limits by this procedure. For example, when a thirty-centimeter rod of silicon is so processed, only about fifteen centimeters of the rod will be found to have dopant concentration within the specified range of limits. The dopant concentration in the remainder of the silicon will be too low. Thus, about half of the silicon in the rod must be reprocessed to make it suitable for use as indium-doped detector material. The concentration of indium in the silicon rod falls below the lower specified limit because indium is so highly volatile. A significant portion of the original charge of indium simply vaporizes out of the melt zone and is thereby lost to the process.

Another disadvantage of the prior-art procedure arises from the extensive handling and tooling required to prepare the polycrystalline rod for doping. Extreme care is required to prevent contamination of the silicon with undesired impurities during the steps of coring, charging with dopant and plugging. Although cleaning of the tooled silicon with acid is usually successful, there remains a risk that the resulting doped silicon will not meet specifications because of contamination due to the tooling and handling.

A third disadvantage of the prior-art procedure described above arises from the fact that, on occasion, a rod of polycrystalline silicon being doped and converted to single-crystal structure will lose that structure at some point during processing. When this occurs, the procedure cannot be restarted since the amount of indium remaining in the silicon is insufficient to produce the desired heavy dopant concentration. The rod must be removed from the crystal grower, recored, recleaned, recharged with dopant and then replugged before another attempt can be made to convert it to doped, single-crystal material. This additional handling requires a considerable amount of extra time and expense. The additional handling also increases the risk that the rod will be contaminated as discussed above.

Thus, there is a need for an improved approach to producing single-crystal rods of silicon doped with indium to heavy concentrations of dopant within specified preselected limits. The improved approach will preferably be capable of producing, as desired, either a uniform dopant concentration along the length of a rod or a desired variation of dopant concentration. In order to accomplish this, it is important to be able both to vary and to control the amount of dopant which is available for doping a given portion of the semiconductor rod. The improved approach will preferably require no tooling of the silicon rod and only a minimum of handling. And, on those occasions when the single-crystal structure of the silicon rod breaks down during processing, the improved procedure will preferably be capable of being restarted for the same pump-down of the crystal grower without demounting the silicon rod from the crystal grower.

Procedures and apparatus for doping silicon which use a dopant-containing gas continuously fed through tubing to the vicinity of the melt zone in a float-zone crystal grower would appear to have some of the desired advantages mentioned above. Examples of this approach are given in the following references: E. Enk et al, U.S. Pat. No. 3,141,848, "Process for the Doping of Silicon", July 21, 1964; Katz et al, "Gas Doping of Float Zone Silicon Crystals in Vacuum From a Solid Source Using Pressure Differential to Transport Dopant", Journal of Crystal Growth 19 (1973) 113–116; Keller, U.S. Pat. No. 3,804,682, "Method for Controlled Doping of Semiconductor Crystals", Apr. 16, 1974; and Keller et al, U.S. Pat. No. 4,126,509, "Process for Producing Phosphorus-Doped Silicon Monocrystals Having a Select Peripheral Dopant Concentration Along a Radial Cross-Section of Such Monocrystal", Nov. 21, 1978. However, it is impractical to attempt to convey gaseous elemental indium from an external source to the vicinity of the melt zone. A carrier gas could be used to transport indium, but the carrier gases known to be capable of doing this would, upon coming in contact with the molten silicon, tend to contaminate it with more carbon than is acceptable in detector grade semiconductor material.

Procedures and apparatus for doping silicon which continuously advance a small rod of heavily-doped silicon toward the melt zone of a larger undoped rod of silicon would also appear to have the capability of providing some control of the rate of doping of the larger rod of silicon along its entire length. This approach is illustrated in the following references: E. Enk et al, cited above, and Keller, U.S. Pat. No. 3,954,416, "Apparatus for Positively Doping Semiconductor Crystals During Zone Melting", May 4, 1976. A related approach is illustrated in Kohl et al, U.S. Pat. No. 4,110,586, "Manufacture of Doped Semiconductor Rods", Aug. 29, 1978. In the process of the latter reference, a small rod of heavily doped silicon is positioned with its axis substantially parallel to the axis of a large rod of undoped silicon. The two rods are fused together and jointly subjected to the zone melting process. However, these approaches appear to be incapable of being restarted during the same pump-down of the crystal grower if single-crystal structure is lost. Furthermore, in these approaches it is very difficult to control the amount of indium actually introduced into the silicon with sufficient precision. This is so for two reasons. First because the indium is initially combined with a certain amount of silicon in the small doping rod, the total amount of indium available can only be indirectly determined by measuring the resistivity of the small rod. This indirect measurement is subject to significant errors. Second, because of the high volatility of the indium, most of it will be evaporated from the small doping rod before it comes in contact with the melt zone of the larger undoped rod of silicon. Thus, a significantly larger amount of indium must be present in the small doping rod than is expected to find its way into the finished rod. The need for making available an excess of indium also reduces the precision with which the amount of indium entering the larger undoped rod can be controlled. In some cases, the amount of indium required to be made available is as much as ten times the amount of indium which eventually is fixed in the silicon.

SUMMARY OF THE INVENTION

It is an object of the invention to overcome the above-noted shortcomings of the prior art.

Another object of the invention is to provide a body of single-crystal semiconductor material such as silicon uniformly doped with a highly volatile dopant such as indium to a desired heavy concentration of dopant.

Yet another object of the invention is to provide a body of single-crystal semiconductor material such as silicon having a specified variation of concentration of a highly volatile dopant such as indium along its length.

Still another object of the invention is to provide detector grade semiconductor material.

An additional object of the invention is to prepare doped single-crystal semiconductor material from an undoped rod of purified polycrystalline semiconductor material without tooling and with only a minimum of handling whereby the risk of contaminating the semiconductor material is minimized.

A further object of the invention is to provide apparatus and a process for forming a rod of single-crystal semiconductor material doped with a highly volatile dopant wherein the process may be restarted for the same pump-down of a crystal grower without demounting the semiconductor rod from the crystal grower.

A still further object of the invention is to provide apparatus and a method for making semiconductor material doped to a heavy concentration of a highly volatile dopant wherein the concentration of dopant in the semiconductor material is readily controlled to fall within a relatively narrow range between specified, preselected limits.

Another object of the invention is to provide apparatus and a method for doping semiconductor material wherein an operator may readily vary and control the amount of dopant fed into the melt zone of a body of semiconductor material.

According to the present invention, the foregoing and other objects are attained by associating a holder for temporarily storing pieces or pellets of solid dopant material with a float-zone crystal grower. The storage holder is disposed outside the housing of the of the crystal grower. In the preferred embodiment, a rotatable cylinder in the storage holder has a plurality of chambers. These chambers hold the stored pieces of dopant material. An exit port in the storage holder leads to an outlet conduit which, in turn, passes through the crystal grower housing into the vicinity of the induction heating coil. The exit opening of the outlet conduit is positioned near the melt zone of a rod of semiconductor material mounted in the crystal grower. Inert gas under pressure fed into the storage holder and through a selected chamber expels the charge of dopant therein and propels the dopant into the crystal-grower housing and thence into the melt zone.

BRIEF DESCRIPTION OF THE DRAWINGS

FIG. 1 is a cross-section view, in elevation, of a holder for storing dopant in accord with the invention.

FIG. 2 is a top view of the dopant holder of FIG. 1.

FIG. 3 is a schematic view, partially in section, of a float-zone crystal grower constructed in accordance with the principles of the invention.

DESCRIPTION OF THE PREFERRED EMBODIMENT

Referring now to FIG. 1, there is shown a holder 10 for temporarily storing pieces or pellets of solid dopant material. A cylinder 12 is mounted for rotation in a holder body 14. A shaft 16 for the cylinder 12 extends downward out of the holder body 14. The shaft 16 may be manually or mechanically rotated to turn the cylinder 12. Visible in FIG. 1 are two cylindrical open spaces or chambers 18 and 18' in the cylinder 12 in which pellets of solid dopant may be placed. Each chamber 18 is preferably made large enough to contain the maximum amount of dopant which is likely to be required to be delivered at one time to the melt zone of a rod of semiconductor material. The chamber 18' at the left side of the holder 10 in FIG. 1 is positioned adjacent an exit port 20 of the holder 10. The exit port 20 is a passageway in the holder body 14 in which pellets of dopant from the chamber 18' may travel to an outlet conduit 22. The tubing of outlet conduit 22, in turn, provides a means by which pellets of dopant pass through the housing of a float-zone crystal grower and approach the molten semiconductor material therein, as is discussed below in connection with FIG. 3.

A cover 24 for the holder 10 is fastened by bolts 26 to the body 14. The cover 24 is preferably of clear material such as glass or plastic to permit an observer to view the contents of the chambers 18. An O-ring 28 is disposed to provide a gas-tight seal between the cover 24 and body 14. The seal enhances the ability of inert gas under pressure, when applied to an inlet conduit 30, to propel dopant originally stored in chamber 18' out exit port 20 into the outlet conduit 22 as indicated by the arrows 32.

FIG. 2 shows a view of the holder 10 looking down at the holder cover 24. A plurality of chambers 18 for holding pieces of dopant are disposed in a ring adjacent to the periphery of the cylinder 12. The chamber 18' is positioned adjacent to exit port 20. Inert gas under pressure applied through inlet conduit 30 propels dopant originally stored in chamber 18' into exit port 20 and thence into outlet conduit 22. After this occurs, the cylinder 12 may be rotated as indicated by the arrow 34 to bring another chamber 18 still charged with dopant adjacent to exit port 20.

It should be noted that each chamber 18 may be charged with an amount of dopant which is different from that placed in any other chamber 18, as desired by the operator. This feature permits great precision and flexibility in controlling the amount of dopant fed to a melt zone either for obtaining uniformity of dopant concentration or for obtaining a desired variation of dopant concentration along the length of a rod of finished semiconductor material. For example, when doping silicon with indium to obtain a uniformly doped rod of detector grade material, it is preferable to initially feed a rather large charge of indium into the melt zone of the silicon rod. Thus, the first chamber or the first few chambers 18' to be emptied of dopant may have large amounts of indium originally placed therein. Once the process is stabilized, however, smaller amounts of indium from subsequently emptied chambers 18' may be fed into the melt zone in amounts calculated to replace the lost vaporized indium and the indium fixed in the solidified single-crystal silicon. The exact amounts of indium required to be loaded into the individual chambers 18 is determined empirically by the operator since these amounts will vary depending on the size of the rod of single-crystal silicon being made and on the characteristics of the particular crystal grower being used.

FIG. 3 illustrates a float-zone crystal grower 40 modified in accord with the principles of the invention but otherwise well known to those skilled in the art. Inside a gas impermeable housing 42 is included an inner reaction chamber 44 and a gas outlet 46. The gas outlet 46 is connected with a source of vacuum (not shown). During doping, the chamber 44 is providing with a back-fill of inert gas, generally argon, through an inlet port 47. A silicon rod 48 is positioned within the reaction chamber 44 on mounting means 50 and 52 respectively. The silicon rod 48 is composed of a stock portion 54, a single-crystal portion 56 and a floating melt zone 58. The mounting means 50 and 52 extend through opposing walls of housing 42 and are operationally connected for movement to transport means 60 whereby at least one of the mounting means is rotatable about its axis to rotate the growing crystal 56 and both of the mounting means are axially movable as diagrammatically indicated by the arrows associated with the reference numeral 60. A heating means, such as an induction heating coil 62 that is provided with a high frequency current, is mounted within the chamber 44 on a suitable support means 64 so as to surround a portion of the silicon rod 48. Upon energization, the heating means creates the melt zone 58 on rod 48 and as the rod 48 is moved via means 60, melt zone 58 likewise moves relative to the rod 48. This type of apparatus is known as a float-zone crystal grower.

The float-zone crystal grower of FIG. 3 differs from the prior art in that it is equipped with means for temporarily storing a plurality of separate or distinct charges of solid dopant material such as the holder 10 shown in FIGS. 1 and 2. A source 68 of an inert gas under pressure is connected to the interior of the holder 10 through inlet conduit 32 as discussed above. The shaft 16 of the cylinder 12 (see FIGS. 1 and 2) extends from the bottom of the holder 10 to a controller 70. The controller 70 may simply be a knob attached to the shaft 16 which an operator may manually turn to deliver a new charge of dopant into the float-zone crystal grower 40 at an appropriate time. Or, if desired, the controller 70 may be any suitable type of mechanical device for automatically turning the shaft 16 through an appropriate increment of angular displacement.

The turning of the shaft 16 by the controller 70 may be caused to occur, for example, upon the occurrence of a specified event such as the passage of a predetermined interval of time. As another example, the shaft 16 may be turned by the controller 70 when the transport means 60 has moved the single crystal portion 56 of the silicon rod 48 over a predetermined distance.

The outlet conduit 22 of the dopant holder 10 is shown in section in FIG. 3 extending through the housing 42. The outlet conduit 22 is positioned in working relation with the float-zone crystal grower described so that the exit end 72 thereof terminates in the vicinity of the melt zone 58 or, equivalently, in the vicinity of the induction coil 62 so that the dopant passing down the outlet conduit 22 is directed into the melt zone 58.

As has been indicated, the apparatus of FIG. 3 is particularly well suited for use when the dopant is indium. With this apparatus, the entire rod 48 of silicon may be readily doped to a desired heavy concentration of indium within a narrow range defined by preselected limits of concentration. If crystal structure is lost early, the process may be restarted. In that case, there is no need to demount the silicon rod 48 or to break the vacuum inside the housing 42.

While the invention has been shown and described with reference to a particular preferred embodiment, it will be understood by those skilled in the art that various changes in details may be made therein without departing from the spirit and scope of the invention as set forth in the following claims.

What is claimed is:

1. A method of doping semiconductor material with a highly volatile dopant in a float-zone crystal grower, the crystal grower comprising a gas impermeable housing, an induction heating coil disposed within the housing, and means for transporting a rod of the semiconductor material through the coil, said method comprising the steps of:
    (a) disposing a holder for storing solid pieces of said dopant outside the housing, wherein said holder comprises a rotatable cylinder having a plurality of distinct chambers;
    (b) providing feed means for propelling the dopant from one of said chambers through an exit port of said holder and into the housing in the vicinity of the coil whereby said dopant may enter a melted zone of said rod of semiconductor material;
    (c) distributing a plurality of solid pieces of said dopant into said chambers;
    (d) rotating said cylinder until a selected chamber is positioned adjacent said exit port;
    (e) delivering inert gas under pressure into the interior of said holder and into said selected chamber;
    (f) expelling the dopant from said selected chamber through said feed means into the melted zone of said rod of semiconductor material;
    (g) rotating said cylinder until a different selected chamber is positioned adjacent said exit port; and
    (h) repeating steps (e) through (g) until said rod of semiconductor material is doped.

2. The method recited in claim 1 further comprising the step of waiting until a specified event occurs before proceeding from step (f) to step (g).

3. The method recited in claim 2 wherein said specified event is the passage of a predetermined interval of time.

4. The method recited in claim 2 wherein said specified event is the displacement of a portion of said rod of semiconductor material over a predetermined distance.

* * * * *